US010301171B1

(12) United States Patent
Chakravarty et al.

(10) Patent No.: US 10,301,171 B1
(45) Date of Patent: May 28, 2019

(54) WAFER LEVEL PACKAGING FOR MEMS DEVICE

(71) Applicant: GLOBALFOUNDRIES Singapore Pte. Ltd., Singapore (SG)

(72) Inventors: Siddharth Chakravarty, New York, NY (US); Pradeep Yelehanka, Singapore (SG); Sharath Poikayil Poikayil Satheesh, Singapore (SG); Chun Hoe Yik, Singapore (SG); Rakesh Kumar, Singapore (SG); Natarajan Rajasekaran, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/810,163

(22) Filed: Nov. 13, 2017

(51) Int. Cl.
*B81B 3/00* (2006.01)
*B81B 7/00* (2006.01)
(Continued)

(52) U.S. Cl.
CPC ............. *B81B 3/0016* (2013.01); *B81B 3/00* (2013.01); *B81B 7/00* (2013.01); *B81B 7/0041* (2013.01); *B81B 7/0051* (2013.01); *B81B 7/02* (2013.01); *B81C 1/00269* (2013.01); *B81C 1/00325* (2013.01); *B81C 1/00579* (2013.01); *B81C 1/00984* (2013.01); *H01L 21/52* (2013.01);
(Continued)

(58) Field of Classification Search
CPC ....... B81B 3/0016; B81B 3/00; B81B 7/0041; B81B 7/00; B81B 7/02; B81B 7/0051; B81B 2207/09; B81B 2203/0127; B81C 1/00984; B81C 1/00269; B81C 1/00579; B81C 1/00325; B81C 2203/0118; B81C 2003/039; H01L 23/481; H01L 23/5226; H01L 23/522; H01L 21/52; H01L 21/56; H01L 21/76898
USPC .............. 257/414, 415, 416, 418, 692, 751, 257/E21.499, E21.5, E21.502, E21.505, 257/E21.567, E23.142, E27.009, E29.324; 438/50, 51, 106, 107, 118, 455
See application file for complete search history.

(56) References Cited

U.S. PATENT DOCUMENTS 5,551,294 A 9/1996 Hermann
6,610,582 B1 8/2003 Stewart
(Continued)

OTHER PUBLICATIONS

Niels Quack et al., Wafer Level AlGe Eutectic Bonding for MEMS-Electronic-Photonic Heterogeneous Integration, International Nano-Optoelectronics Workshop, Aug. 7-15 2012, US.
(Continued)

*Primary Examiner* — Dao H Nguyen
(74) *Attorney, Agent, or Firm* — Thompson Hine LLP

(57) ABSTRACT

A microelectromechanical system (MEMS) device is disclosed. The MEMS device includes a device substrate with a top device surface and a bottom device surface having a MEMS component in a device region. A top device bond ring is disposed on the top device surface surrounding the device region and a bottom device bond ring is disposed on the bottom device surface surrounding the device region. A top cap with a top cap bond ring is bonded to the top device bond ring by a top eutectic bond and a bottom cap with a bottom cap bond ring is bonded to the bottom device bond ring by a bottom eutectic bond. The eutectic bonds encapsulate the MEMS device.

19 Claims, 12 Drawing Sheets

(51) Int. Cl.
*B81B 7/02* (2006.01)
*B81C 1/00* (2006.01)
*H01L 21/52* (2006.01)
*H01L 21/56* (2006.01)
*H01L 23/48* (2006.01)
*H01L 21/768* (2006.01)
*H01L 23/522* (2006.01)

(52) U.S. Cl.
CPC ........ *H01L 21/56* (2013.01); *H01L 21/76898* (2013.01); *H01L 23/481* (2013.01); *H01L 23/522* (2013.01); *H01L 23/5226* (2013.01); *B81B 2203/0127* (2013.01); *B81B 2207/09* (2013.01); *B81C 2203/0118* (2013.01); *B81C 2203/036* (2013.01)

(56) References Cited

U.S. PATENT DOCUMENTS

| | | | |
|---|---|---|---|
| 6,743,656 | B2 | 6/2004 | Orcutt et al. |
| 7,372,074 | B2 | 5/2008 | Milne et al. |
| 8,084,332 | B2 | 12/2011 | Nasiri et al. |
| 8,507,913 | B2 | 8/2013 | Nunan et al. |
| 8,587,077 | B2 | 11/2013 | Chen |
| 9,778,039 | B2 * | 10/2017 | Najafi ................. G01C 19/5769 |
| 9,938,134 | B2 * | 4/2018 | Lin ........................ B81B 7/0038 |
| 2009/0297770 | A1 | 12/2009 | Yoshida et al. |
| 2010/0218977 | A1 | 9/2010 | Inoue et al. |
| 2012/0025199 | A1 | 2/2012 | Chen et al. |
| 2012/0142144 | A1 * | 6/2012 | Taheri ..................... B81B 7/007 438/107 |
| 2013/0161820 | A1 | 6/2013 | Gonsk et al. |
| 2013/0193527 | A1 * | 8/2013 | Chu .................. H01L 21/76898 257/414 |
| 2013/0203199 | A1 * | 8/2013 | Huang ................. B23K 20/002 438/51 |
| 2013/0277777 | A1 * | 10/2013 | Chang ....................... B81B 7/00 257/418 |
| 2013/0299924 | A1 | 11/2013 | Weber et al. |
| 2014/0264648 | A1 * | 9/2014 | Chu .................... B81C 1/00134 257/415 |
| 2015/0191345 | A1 | 7/2015 | Boysel et al. |
| 2015/0375995 | A1 * | 12/2015 | Steimle ............... B81C 1/00238 257/418 |

OTHER PUBLICATIONS

Vivek Chidambaram et al., Development of CMOS Compatible Bonding Material and Process for Wafer Level MEMS Packaging Application under Harsh Environment, 2012 International Conference on Solid-State and Integrated Circuit(ICSIC 2012), Mar. 17, 2012, Singapore.

Filip Crnogorac et al., Aluminum-Germanium Eutectic Bonding for 3D Integration, 2009 IEEE International Conference on 3D System Integration, 2009, pp. 1-5, IEEE.

* cited by examiner

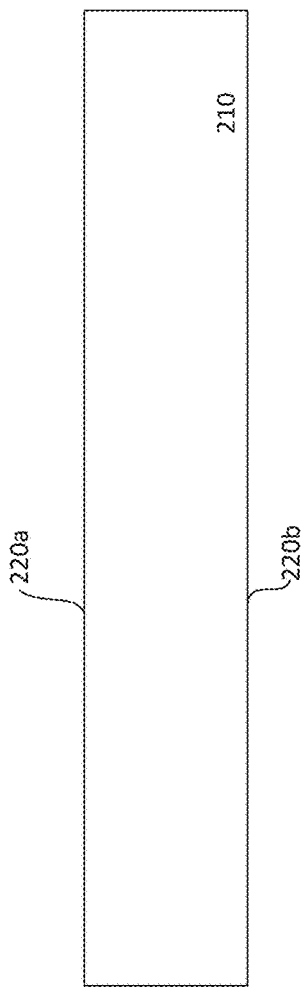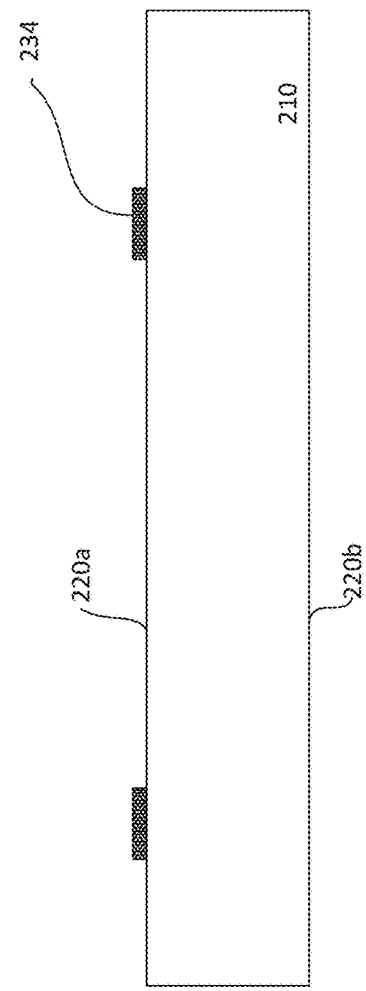

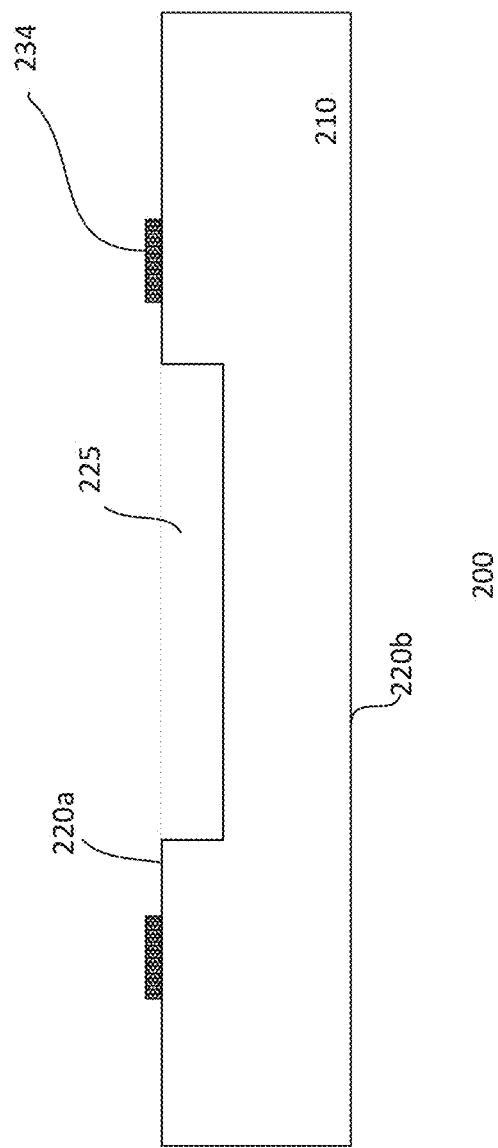

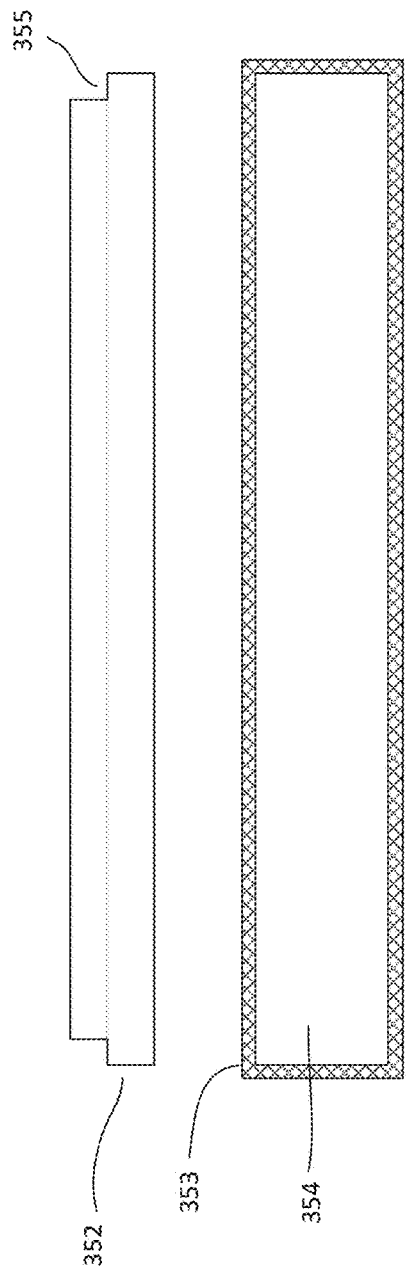
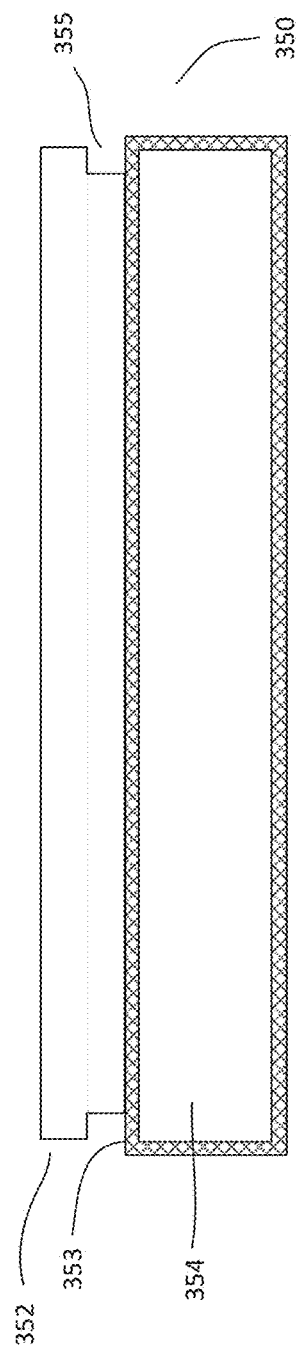
Fig. 3a
Fig. 3b

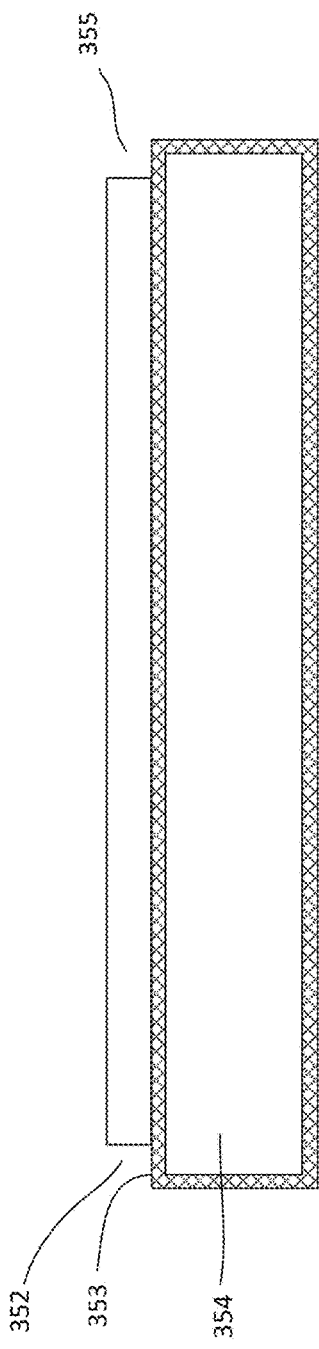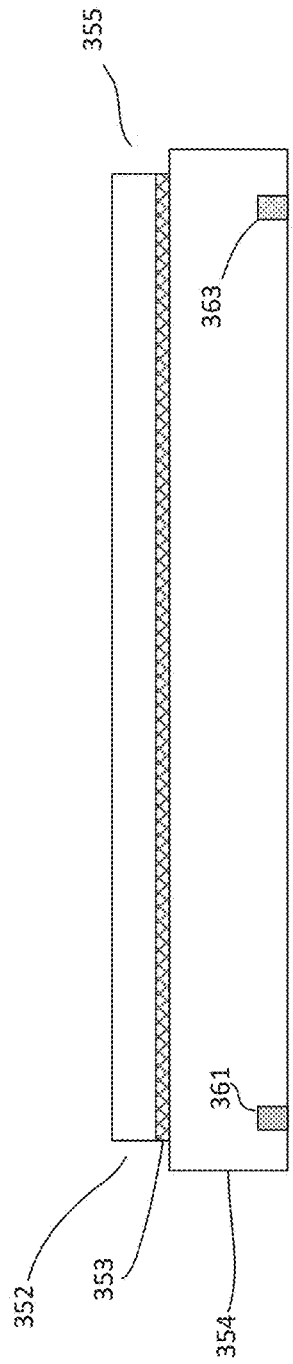

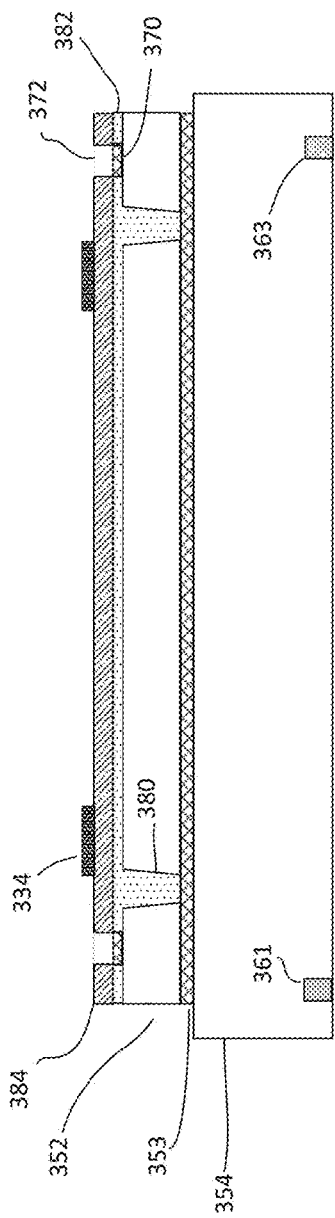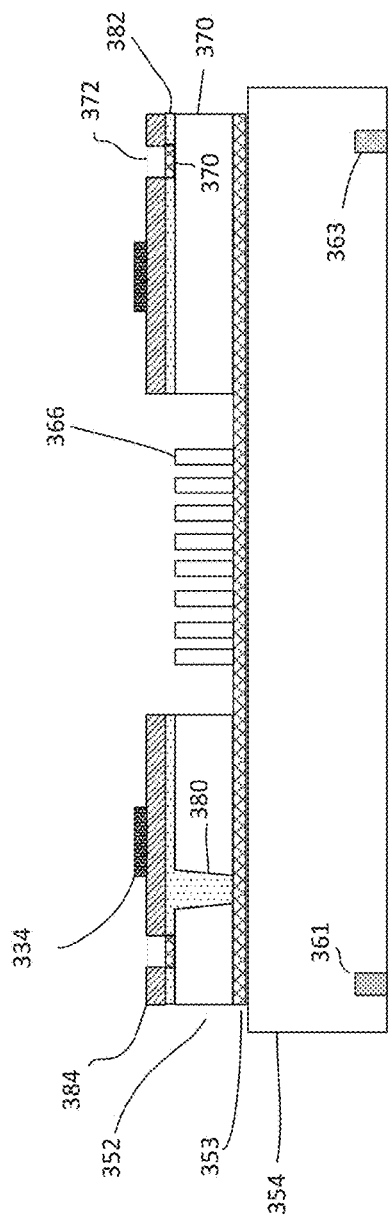

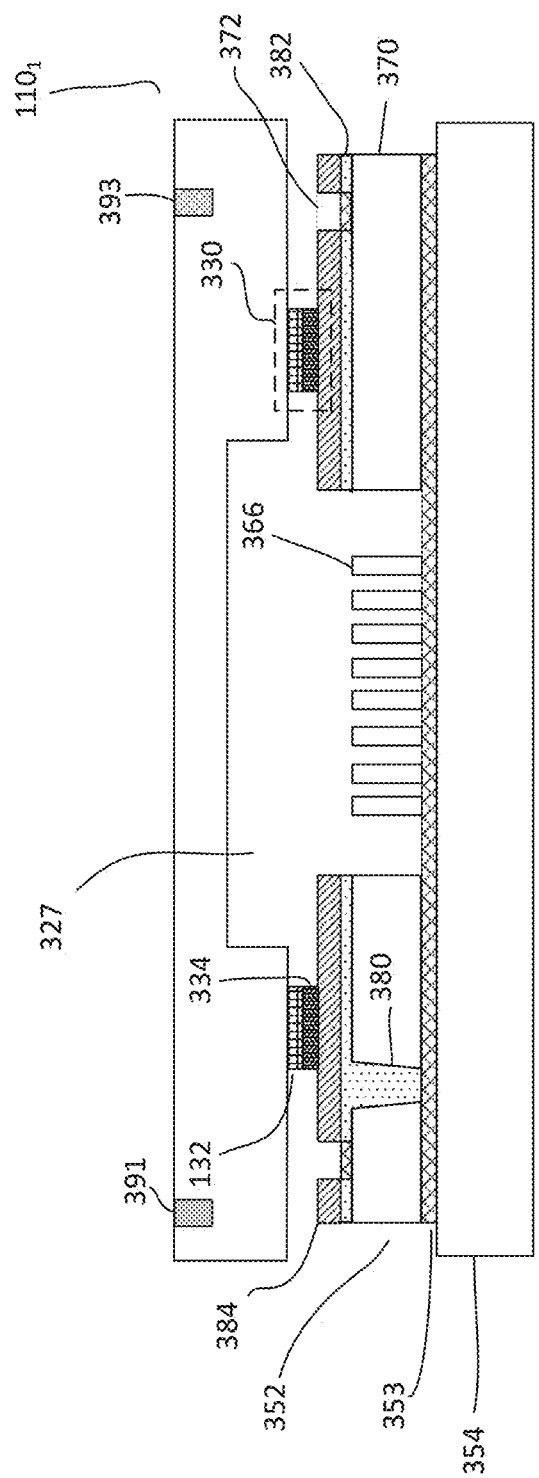

WAFER LEVEL PACKAGING FOR MEMS DEVICE

BACKGROUND

Recent innovations in three-dimensional (3D) chip, die and wafer integration (hereinafter, collectively, stacked structures) have enabled a greater miniaturization of devices as well as technological advancements in increased speed and density, with reduced power consumption and cost. Wafer packaging technology on a wafer-level allows for vertical stacking of two or more wafers and to provide electrical connection and hermetical sealing between the wafers.

Various wafer bonding techniques have been developed and employed to join two or more wafers of the same or different types. However, fabrication of micro-electromechanical systems (MEMS) device involves making released structures that move mechanically, thereby resulting in, among other issues, stiction between surfaces and thermal stress induced instability in the final device.

From the foregoing discussion, it is desirable to provide a wafer level packaging for MEMS device that reduces stiction, improves thermal stability and hermetic or vacuum sealing in the final device.

SUMMARY

Embodiments of the present disclosure generally relate MEMS devices and the method of making thereof. In one embodiment, a method for forming a MEMS device includes providing a device wafer having a top device surface and a bottom device surface. The device wafer is processed with a MEMS component in a device region of the device wafer, such that the top and bottom device surfaces include a device top and bottom bond ring surrounding the device region respectively. The method continues by providing a top cap wafer with an outer top cap surface and an inner top cap surface, such that the top cap wafer comprises a top cap bond ring surrounding the device region. Similarly, the method also includes providing a bottom cap wafer with an outer bottom cap surface and an inner bottom cap surface, such that the bottom cap wafer comprises a bottom cap bond ring surrounding the device region. The method proceeds by performing a and bottom eutectic bonding process, such that the top eutectic bonding process forms a top eutectic bond between the top cap bond ring and the top device bond ring, and the bottom eutectic bonding process forms a bottom eutectic bond between the bottom cap bond ring and the bottom device bond ring.

In another embodiment, a device microelectromechanical system (MEMS) device includes a device substrate with a MEMS component in a device region. The device substrate includes a top device surface with a device top bond ring surrounding the device region and a bottom device surface with a device bottom bond ring surrounding the device region. The device also includes a top cap with an outer and inner top cap surface and a top cap bond ring surrounding the device region, as well as a bottom cap with an outer bottom and inner bottom cap surface, and a bottom cap bond ring surrounding the device region. The MEMS component is encapsulated by a top and bottom eutectic bond, in which the top eutectic bond seals the top cap to the top device surface of the device substrate and the bottom eutectic bond seals the bottom cap to the bottom device surface of the device substrate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which:

FIGS. 2a-2c show the process of forming a first or second cap wafer of the encapsulated MEMS device; and FIGS. 3a-3l show the process of forming a device wafer stack and encapsulating MEMS device wafer with top and bottom cap wafers.

DETAILED DESCRIPTION

Embodiments generally relate to microelectromechanical system (MEMS) devices. Generally, MEMS devices are processed in parallel on a wafer, such as a silicon or silicon-on-insulator (SOI) wafer. Other types of wafers may also be used to form the MEMS devices. After processing, the wafer is diced to separate the devices.

Figure 1A:
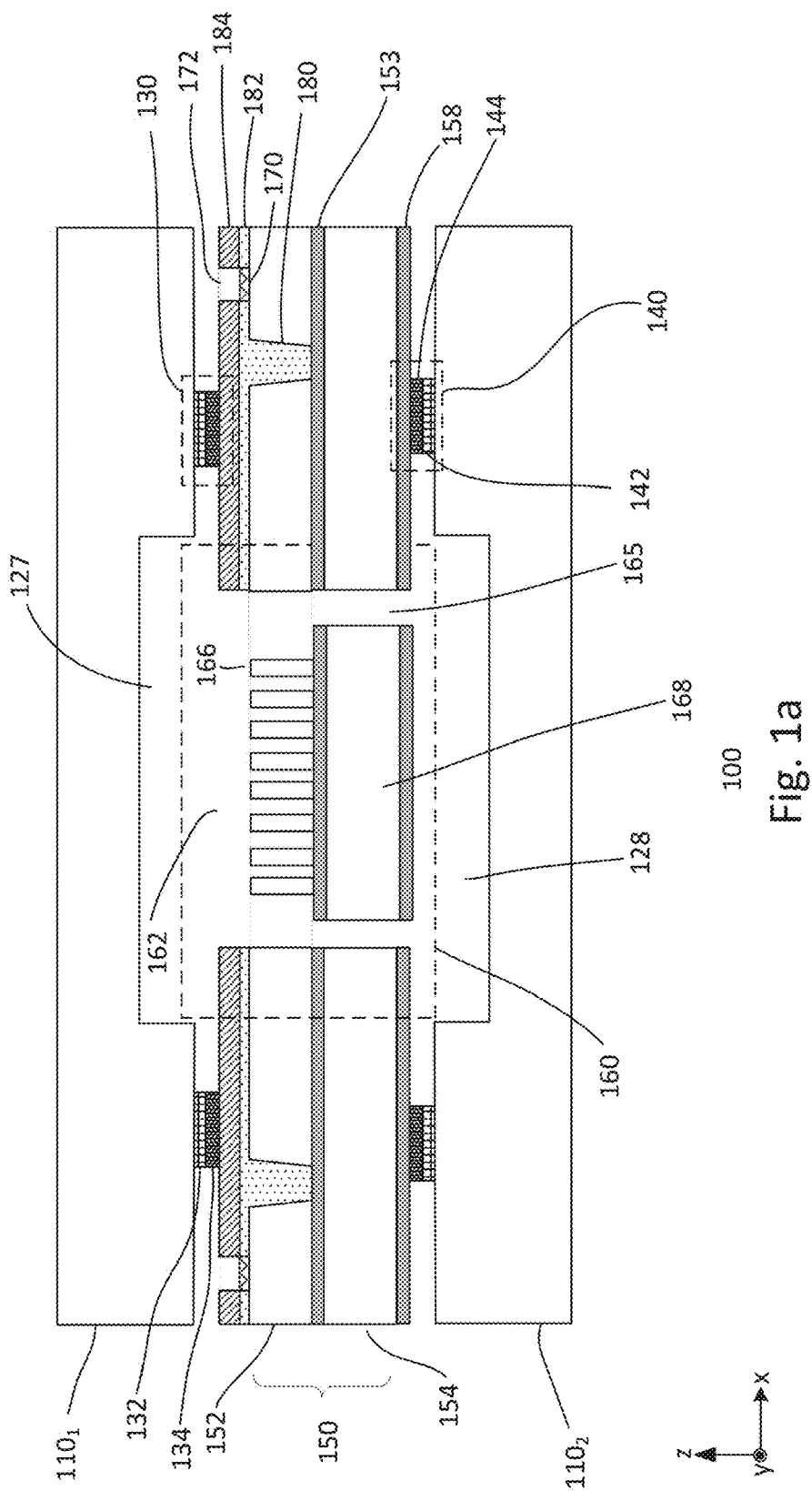
FIGS. 1a-1b show various views of an embodiment of an encapsulated MEMS device.
Figure 1B:
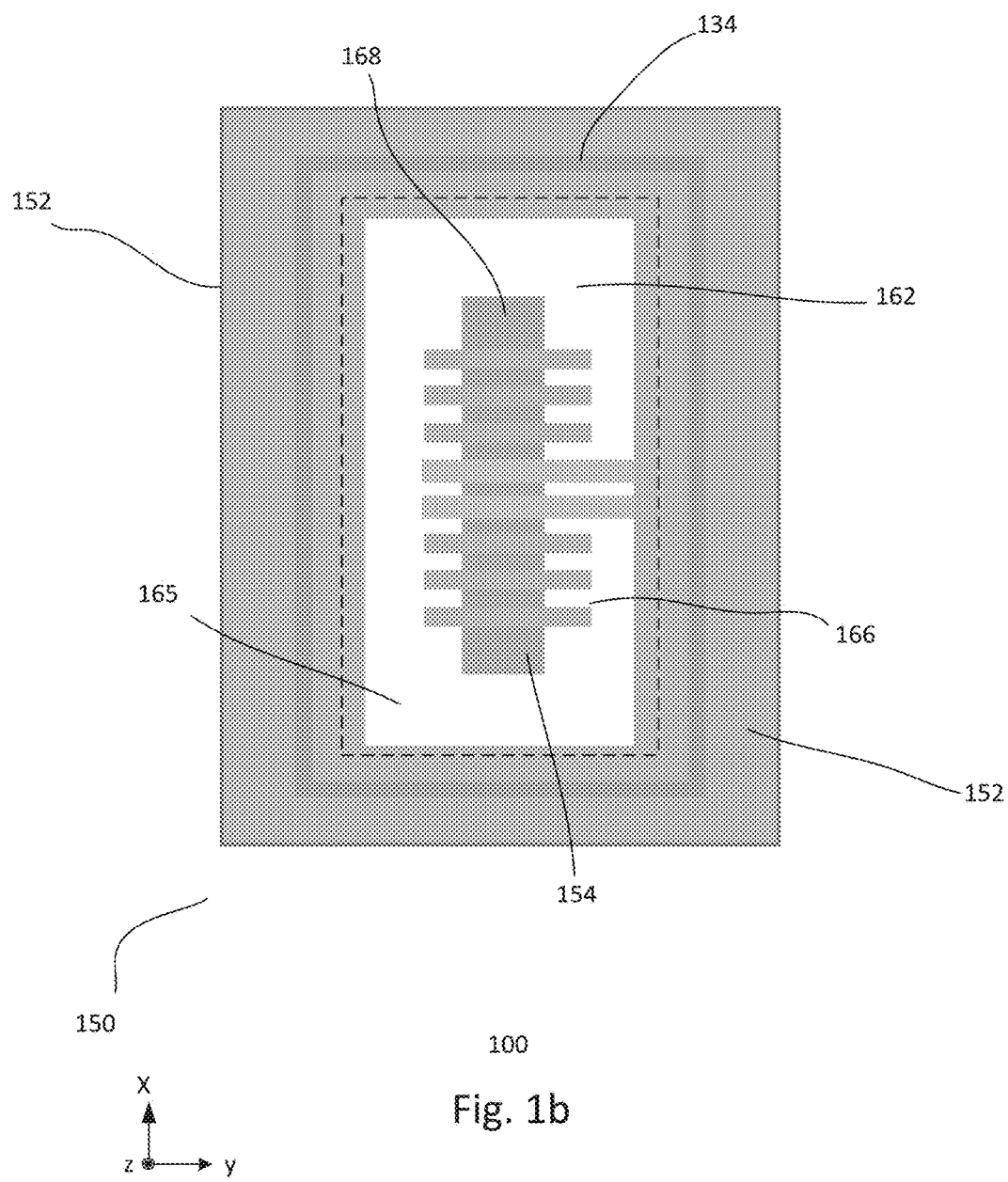

FIGS. 1a-1b shows various views of an embodiment of a microelectromechanical system (MEMS) device 100. FIG. 1a shows a cross-sectional view of the device 100 along an x-direction and FIG. 1b shows a plan view of a device substrate 150 of the device 100.

Referring to FIGS. 1a-1b, the device includes MEMS device substrate 150. The MEMS device substrate, as shown, includes multiple substrates. In one embodiment, the device substrate includes a surface substrate 152 and a base or proof mass substrate 154. A dielectric layer 153 is disposed between the surface and base substrate. The substrates, for example, are silicon substrates. Other types of substrates may also be useful. The dielectric layer, for example, is silicon oxide which facilitates fusion bonding of the substrates. The silicon oxide may be thermal oxide. The thickness of the dielectric layer may be about 1 μm. Other thicknesses may also be useful.

In other embodiments, the substrate may be a crystalline-on-insulator (COI) such as a silicon-on-insulator (SOI) substrate. The SOI substrate includes a surface silicon substrate 152 and a bulk silicon substrate 154 separated by a buried oxide (BOX) 153, such as silicon oxide. Other types of COI or non-COI substrates may also be used as the device substrate. In the case of a SOI substrate, the surface substrate of the SOI serves as the surface substrate, the BOX serves as the dielectric layer and the bulk substrate serves as the proof mass substrate of the device substrate. The substrates of the SOI substrate may be similarly doped as the surface and proof mass substrates, as described.

The device substrate includes a component region with a MEMS component 160. The MEMS component may be any types of MEMS component. For example, the MEMS component may be an inertial MEMS component, such as a fluidic MEMS component, a medical MEMS component, a RF MEMS component. Other types of MEMS components may also be useful. The device substrate includes first and second major surfaces. The first major surface may be referred to as the top surface and the second major surface may be referred to as the bottom surface. The device substrate may be part of a wafer in which a plurality of MEMS devices are formed.

The substrates may be doped substrates. For example, the surface substrate and the proof mass substrate may be doped substrates. The doped substrates may be doped to provide low resistance substrates. Alternatively, the substrates may be undoped or a combination of a doped and an undoped substrate. The type of substrate (doped or undoped) may depend on the type of MEMS component.

In an exemplary embodiment, the MEMS component includes an actuator 162. The actuator may include a plurality of actuator fins 166 patterned in device region of the surface substrate. As shown, the actuator fins are elongated fin members disposed in the y direction and completely separated from the surface substrate. As shown, some fins are coupled to the surface substrate while others are disconnected from the surface substrate. The proof mass substrate is patterned to form a proof mass base 168 which is surrounded by a release channel 165. The base may be an elongated member in, for example, the x direction. The actuator fins are disposed on the base. The device substrate may include other types of patterns or MEMS components, such as a resonator.

As discussed, the pattern of the actuator is an exemplary embodiment created from the device substrate. The device component may have other patterns or pattern features. In addition, other layers may be provided on the device substrate which are used to form the component. The pattern may form other types of actuators or MEMS components, such as resonators. The pattern features may depend on, for example, the type of MEMS component.

The surface substrate, as shown, includes an isolation region 180. The isolation region, for example, is a shallow trench isolation (STI) region. The STI region includes a trench filled with, for example, silicon oxide. Other types dielectric or isolation fill may also be useful. The depth of the trench, for example, extends to the dielectric layer 153. The isolation region isolates the device region on the surface substrate. The isolation region prevents or reduces parasitic leakage.

The top surface of the surface substrate includes a top device dielectric layer. In one embodiment, the top device dielectric layer includes a device dielectric stack with first and second dielectric layers 182 and 184. The first dielectric layer may be part of the dielectric fill of the isolation region, such as silicon oxide. The second dielectric layer may be, for example, silicon oxide. The silicon oxide dielectric fill and layer may be TEOS formed by plasma enhanced chemical vapor deposition (PECVD TEOS or PTEOS). Other types of dielectric layers, such silicon nitride or a combination of TEOS and silicon nitride formed by PECVD, may also be useful. The thickness of the first and second dielectric layers may about 1 µm each. Providing dielectric layers having other thicknesses or dielectric materials may also be useful. In other embodiments, the dielectric layer may be a single dielectric layer. Other configurations of the dielectric layer may also be useful.

Contacts 172 may be provided on the surface substrate. As shown, the contacts are disposed outside of the device region in contact via openings in the dielectric layers, beyond the isolation region. A contact, for example, may be a metal contact, such an aluminum (Al) contact. Other types of metal contacts may also be useful. The contacts may have the same height as the first dielectric layer. Providing contacts having other heights may also be useful. In one embodiment, first and second contacts are provided A top device seal or bond ring 134 is disposed on the surface of the top device dielectric layer. For example, the top device bond ring is disposed on the surface of the second dielectric layer of the top device dielectric layer. The bond ring surrounds the device region. In one embodiment, the bond ring is disposed within the isolation region. Other configurations of the bond ring may also be useful. The bond ring facilitates eutectic bonding with another bond ring. The bond ring, for example, may be a metal bond ring, such as Al. Other types of metal bond rings may also be useful. For example, gold (Au), tin (Sn), germanium (Ge), silicon (Si), indium (In), copper (Cu), nickel (Ni), platinum (Pt), titanium (Ti), tantalum (Ta), titanium nitride (TiN) and chromium (Cr).

As described, the bond ring includes a single metal layer. In other embodiments, the bond ring may be a composite bond ring with multiple layers to form a bond ring stack. The multiple layers of the stack may include metal layers, semiconductor layers or a combination thereof. The top layer or exposed layer of the stack includes a layer for facilitating eutectic bonding with another bond ring or bond ring stack.

The bottom surface of the device substrate may include a bottom device dielectric layer 158. The bottom device dielectric layer may be, for example, silicon oxide. The silicon oxide may be thermal oxide. Alternatively, the silicon oxide may be PTEOS. Other types of dielectric layers may also be useful.

Similar to the top surface, the bottom surface includes a bottom device bond ring 144. The bottom bond ring is disposed on the bottom device dielectric layer. The bottom bond surrounds the device region. In one embodiment, the bottom device bond ring may be aligned with the top device bond ring. The bond ring facilitates eutectic bonding with another bond ring. The bond ring, for example, may be a metal bond ring, such as an Al bond ring. Other types of metal bond rings, such as those described for the top device bond ring, may also be useful.

The MEMS device includes a first cap 110$_1$ disposed on the first major surface of the device substrate and a second cap 110$_2$ disposed on the second major surface of the device substrate. The first cap may be referred to as the top cap and the second cap may be referred to as the bottom cap. For example, the top cap is disposed on the top surface of the device substrate and the bottom cap is disposed on the bottom surface of the substrate. The caps, for example, encapsulate the MEMS component, forming an encapsulated MEMS device. The caps may be silicon caps. The caps, for example, may be parts of cap wafers. In one embodiment, the top cap is part of a top cap wafer with a plurality of top caps and the bottom cap is part of a bottom cap wafer with a plurality of bottom caps. The cap wafers may be cap wafers, such as silicon cap wafers. Other types of cap wafers may also be useful.

The top cap includes an inner and an outer top cap surface. The inner top cap surface is the surface which faces the device substrate and the outer surface is the surface which is the opposite surface to the inner surface. For example, the outer top cap surface is exposed to the environment. The inner surface of the top cap includes a recessed surface. The recessed surface forms an upper cavity 127. The recessed surface, for example, encompasses the component region. Similarly, the bottom cap includes an inner and an outer bottom cap surface. The inner bottom cap surface faces the device substrate and the outer bottom cap surface is the opposite surface to the bottom cap inner surface. The inner surface of the bottom cap includes a recessed surface which forms a lower cavity 128. The upper and lower cavities may enable movement of the MEMS component member in, for example, the z direction.

In one embodiment, the top cap includes a top cap bond ring 132. The top cap bond ring is disposed on the non-recessed inner surface of the top cap outside of the component region. The top cap bond ring may be aligned with the top device bond ring. In one embodiment, the top cap bond ring includes a metal bond ring which can form a top eutectic bond 130 with the top device bond ring. In one embodiment, the top device bond ring includes a germanium (Ge) bond ring which forms a top eutectic bond with a top Al device bond ring. Other types of metal bond rings, such as those described with respect to the top device bond ring, may also be useful.

In one embodiment, the bottom cap includes a bottom cap bond ring 142. The bottom cap bond ring is disposed on the non-recessed inner surface of the bottom cap outside of the component region. The bottom cap bond ring may be aligned with the bottom device bond ring. In one embodiment, the bottom cap bond ring includes a metal bond ring which facilitates forming a bottom eutectic bond 140 with the bottom device bond ring. In one embodiment, the bottom device bond ring includes a Ge bond ring which forms a bottom eutectic bond with a bottom Al device bond ring. Other types of metal bond rings, such as those already described, may also be useful.

As described, one embodiment of the eutectic bond includes an Al—Ge eutectic bond formed by Al and Ge bond rings. Other types of eutectic bonds may also be useful. For example, the eutectic bond may be formed by similar types of metals or semiconductors or different types of metals or semiconductors. The type of material used may determine the bonding temperature. In one embodiment, the eutectic bonding temperature is a low eutectic bonding temperature. For example, the bonding temperature is about 300-450° C.

Also, as shown, the inner surfaces of the cap recesses are smooth. In some cases, an inner surface of a cap, for example, the top cap, the bottom cap or both, may include a pattern created by protrusions. In yet other embodiments, the inner surface of a cap, such as the top cap, the bottom cap or both, may be planar (no recess). If the MEMS components, when the cap is mounted, have sufficient mechanical movement in the z direction, a recess or recesses may not be needed. In some instances, the bond rings of the eutectic bonds may provide sufficient height to avoid the need of a recess or recesses. Other configuration of caps and bond rings may also be useful.

In some embodiments, the cap may be a low resistance cap. For example, the cap may be a doped cap. In such case, a via isolation which extends the height of the cap may be provided. The via isolation surrounds the device region of the cap. Such caps with via isolations, for example, is described in concurrently filed patent application GFSP2016NAT15US0, which is herein incorporated by reference for all purposes. The inner surface of one or both caps within the bond ring may be provided with a getter. The getter improves the vacuum in the encapsulated device.

As described, the top cap and bottom cap hermetically seal the MEMS device using double eutectic bonds. The eutectic bonds are performed at the wafer level to encapsulate a plurality of MEMS devices. Furthermore, the use of eutectic bonds at wafer level facilitates forming a thin device structures over a large cavity region. The use of eutectic bonds reduces the thermal budget required to hermetically seal the device. For example, the eutectic bonds are formed from temperatures of 300-450° C. In addition, the eutectic bonds are formed using low pressure. The low temperature and low pressure used in bonding reduce stiction of the device membrane to the cap wafers.

The various wafers, such as the top cap wafer, bottom cap wafer and device wafer, are processed separately prior to bonding. After the different wafers are processed, they may be fusion bonded to form a wafer stack and processed to form encapsulated MEMS devices. The processed wafer stack is then diced to separate the encapsulated MEMS device.

FIGS. 2a-2c show a process 200 for forming a cap on a cap wafer. The process can be employed to form either a top cap or a bottom cap. For example, the process of forming a top cap or a bottom cap on a wafer is similar. In the case where the size of the cavity is different, different reticles may be employed. In the case where a cavity includes a pattern, additional mask and etch processes may be employed to form the cavity.

Referring to FIG. 2a, a cap wafer 210 is provided. As shown, the cap wafer has first and second surfaces 220a and 220b. The first surface, for example, may be referred to as an inner surface and the second surface may be referred to as an outer surface.

In some cases, the cap wafer may be a low resistance wafer, such as a low resistance silicon wafer. For example, the wafer is a doped wafer to provide a low resistance wafer. In the case of a low resistance cap wafer, a via isolation may be formed. The via isolation may surround the device region.

Referring to FIG. 2b, a cap bond ring 234 is formed on the inner surface of the cap wafer. The bond ring, for example surrounds a device region. The bond ring facilitates eutectic bonding with another bond ring. The bond ring may be a metal bond ring, such as Ge. Other types of metal bond rings for which can facilitate eutectic bonding may also be useful. For example, gold (Au), tin (Sn), silicon (Si), indium (In), copper (Cu), nickel (Ni), platinum (Pt), titanium (Ti), tantalum (Ta), titanium nitride (TiN) and chromium (Cr). As described, the bond ring includes a single metal layer. In other embodiments, the bond ring may be a composite bond ring with multiple layers to form a bond ring stack. The multiple layers of the stack may include metal layers, semiconductor layers or a combination thereof. The top layer or exposed layer of the stack includes a layer for facilitating eutectic bonding with another bond ring or bond ring stack.

To form the bond ring, the bond ring layer or layers are formed on the inner surface of the cap wafer. The term bond ring layer may include a single layer or multiple layers. The bond ring layer may be formed by various techniques. For example, the layer or layers may be formed by physical vapor deposition (PVD), E-beam evaporation, electroplating or a combination thereof. The bond ring layer is patterned to form the bond ring. Patterning the bond ring layer may be achieved using mask and etch techniques. For example, a photoresist layer may be exposed with a reticle containing the desired pattern. After development, the desired pattern on the reticle is transferred to the photoresist layer. The patterned photoresist layer serves as an etch mask for an anisotropic etch, such as a reactive ion etch (RIE). The RIE removes the bond layer exposed by the etch mask, forming the bond ring. Other techniques, such as liftoff may also be employed to form the bond ring.

The cap wafer may be processed to form a recess 225. The recess is formed on the inner surface of the cap wafer. The recess may be formed using mask and etch techniques. For example, a RIE using a patterned resist layer as an etch mask to form the recess. The recess serves as a cavity when the cap is bonded to a device wafer. In the case of a top cap wafer, the recess serves as a top cavity over the device region; in the case of a bottom cap wafer, the recess serves as a bottom cavity below the device region. The recess, for example, is surrounded by a non-recessed region of the cap wafer. The non-recessed region, for example, includes the cap bond ring. In addition, the inner surface of one or both the top and bottom caps within the bond ring or component region may be provided with a getter. The getter improves the vacuum in the encapsulated device.

As discussed, the top and bottom caps may have different sized or shaped cavities. This can be easily achieved by using respective reticles for the top and bottom cap wafers to form the recess. In addition, as discussed, a cavity may include a patterned surface. In such cases, the recess may be partially formed using first mask and etch processes followed by second mask and etch processes to form the pattern.

For purpose of simplification, FIGS. 2a-2c have been described in the context of forming a signal cap on a cap wafer. It is understood that the cap wafer may include numerous caps which are bonded in alignment with a device wafer having a plurality of MEMS devices. The bond rings disposed on the inner surface of the cap wafer serve as the cap bonding regions for eutectic bonding with device bond rings of the device wafer.

Figure 3E:
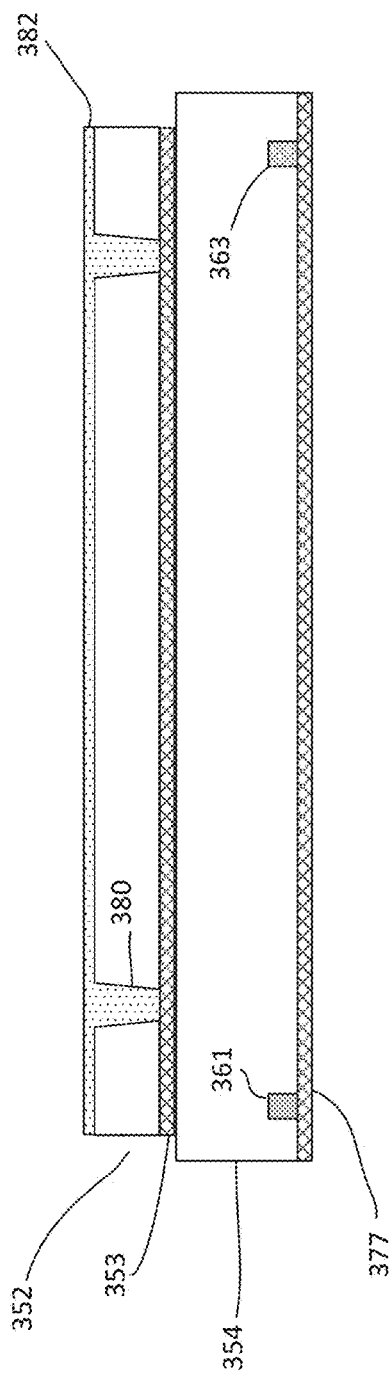

FIGS. 3a-3l show an embodiment of a process 300 for forming a MEMS component of a MEMS device on a device wafer and encapsulating it with top and bottom cap wafers. Referring to FIG. 3a, surface wafer 352 and proof mass wafer 354 are provided. In one embodiment, the surface and proof mass wafers are silicon wafers. Other types of wafers may also be provided. As shown, the edge of the bonding surface of the surface wafer is trimmed. The bonding surface, for example, may be referred to as a bottom surface of the surface wafer. Trimming forms a step 355 at the edge of the surface wafer. The step, in one embodiment, defines a final thickness of the surface substrate. The step, for example, may be about 50 µm. Other thicknesses may also be useful.

As for the proof mass wafer, a dielectric layer 353 is formed. The dielectric layer, for example, is silicon oxide. In embodiment, the silicon oxide is a thermal oxide. The thermal oxide covers the surfaces of the proof mass wafer. For example, the thermal oxide covers top, bottom and side surfaces of the proof mass wafer. The thickness of the dielectric layer may be about 1 µm. Other thicknesses may also be useful. One of the major surfaces serves as a bonding surface of the proof mass wafer. For example, the top surface of the proof mass wafer may serve as a bonding surface of the proof mass wafer. Alternatively, the bottom surface may serve as a bonding surface of the proof mass.

Referring to FIG. 3b, the bonding surface of the surface wafer is bonded to a bonding surface of the proof mass wafer. In one embodiment, the surface wafer and proof mass wafer are fusion bonded together, forming a device wafer. For example, the silicon oxide bonding surface of the proof mass wafer is fusion bonded to the silicon surface of the surface wafer. As shown, the step of the surface wafer faces the proof mass wafer.

In FIG. 3c, the top surface of the surface wafer is grinded to reduce its thickness. In one embodiment, the surface wafer is grinded to have a thickness equal to about the depth of the step of the edge trim. For example, the thickness of the surface wafer is reduced to about 50 µm.

In other embodiments, the device wafer may be a COI wafer, such as a SOI wafer. The SOI wafer includes a surface silicon wafer 352 and a bulk silicon wafer 354 separated by a buried oxide (BOX) 353. The bulk wafer may serve as the proof mass wafer and the BOX serves as the dielectric layer between the surface and proof mass wafers.

Referring to FIG. 3d, the bottom or non-bonded surface of the proof mass wafer is grinded to reduce its thickness. The proof mass wafer may be grinded to have a thickness of about 600 µm. Providing a proof mass wafer with other thicknesses may also be useful. The remaining dielectric layer on the proof mass layer is removed. The remaining dielectric layer may be removed by, for example, a wet etch which removes the dielectric layer selective to the silicon wafers.

First and second alignment marks 361 and 363 are formed on the bottom surface of the proof mass wafer. The alignment marks may be formed after grinding and removing the remaining dielectric layer on the proof mass wafer. The first alignment mark may serve as a lithographic alignment mark and the second alignment may serve as a wafer bonding alignment mark. The alignment marks may be formed as previously described. For example, mask, etch, fill and planarizing techniques may be employed. The alignment marks may be formed using the same or separate processes. The alignment marks may dielectric alignment marks, such as silicon oxide or nitride. Other types of alignment marks may also be useful.

As shown in FIG. 3e, a sacrificial dielectric layer 377 may be formed on the bottom surface of proof mass wafer. The sacrificial dielectric layer, for example, may be a silicon oxide layer deposited on the surface of the surface wafer. The silicon oxide layer may be formed by plasma enhanced CVD (PECVD). Other techniques for forming the sacrificial dielectric layer may also be useful. For example, the dielectric layer may be silicon oxide formed by thermal oxidation. In such cases, the dielectric layer covers the exposed surfaces of the wafers. The dielectric layer may be about 1 µm thick. Other thicknesses may also be useful.

An isolation region 380 is formed in the surface wafer. The isolation region, for example, is a shallow trench isolation (STI) region. To form the STI region, a trench is formed in the surface substrate. The trench, for example, surrounds the device region. The trench may be formed using mask and etch techniques. The trench extends the depth of the surface substrate, exposing the dielectric layer 353. An isolation fill is formed on the surface substrate, filling the trench and covering the surface substrate. The isolation fill, for example, may be silicon oxide. Other types of isolation fills may also be useful. The silicon oxide fill may be deposited by PECVD. Other techniques for forming the isolation fill may also be useful.

In one embodiment, the top surface of the surface substrate is planarized to remove excess isolation fill. For example, a chemical mechanical polish (CMP) is performed to remove excess dielectric isolation fill. In one embodiment, the CMP partially removes the excess isolation fill, leaving a first top dielectric layer 382 disposed over the surface of the surface substrate. The dielectric layer has a planar top surface due to the CMP. The thickness of the dielectric layer, for example, may be about 1 µm. Other thicknesses may also be useful.

Figure 3F:
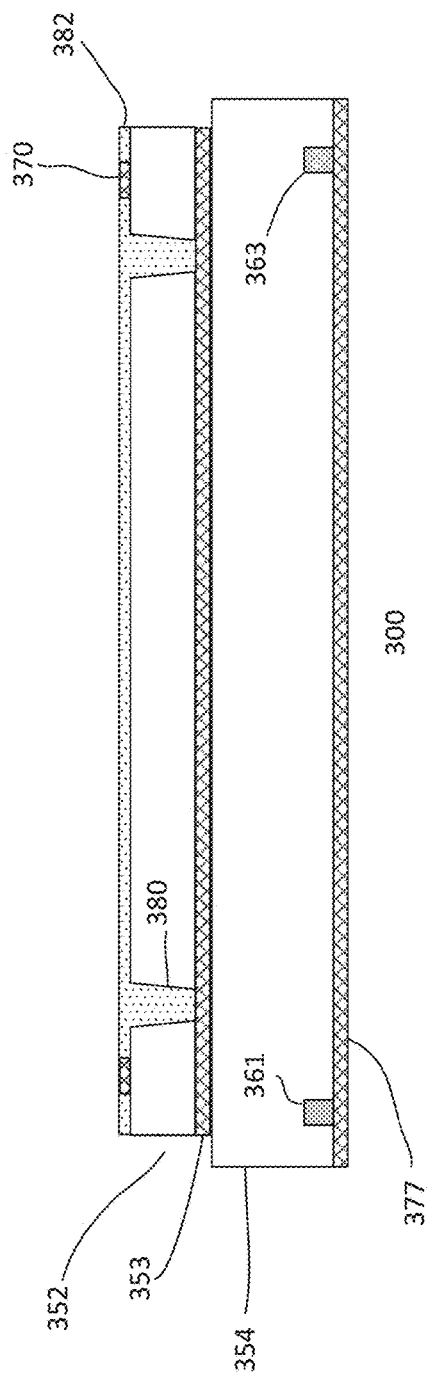

Referring to FIG. 3f, via contacts 370 are formed in the first top dielectric layer. As shown, the dielectric layer includes first and second via contacts. Providing other number of via contacts may also be useful. Forming the via contacts include, for example, forming via openings in the dielectric layer, exposing, for example, the surface substrate. The via openings may be formed by mask and etch techniques. A metal contact layer, such as Al, may be formed on the substrate. Other types of metal contact layers may also be useful. The metal layer may be formed by, for example, by PVD, E-beam evaporation or electroplating. The metal layer fills the via opening and covers the first top dielectric layer.

In one embodiment, the top surface of the surface substrate is planarized to remove excess metal contact layer. Planarizing the surface substrate may be achieved by, for example, CMP. The CMP removes the excess metal layer isolation fill, leaving via contacts in the via openings. The via contacts have planar top surfaces with the first top dielectric layer due to the CMP.

In FIG. 3g, a second top dielectric layer 384 is formed on the surface substrate over the first top dielectric layer and via contacts. The first and second top dielectric layer may serve as a top dielectric layer over the surface substrate. The second top dielectric layer may be a silicon oxide layer. In one embodiment, the second top dielectric layer is a silicon oxide layer formed by PECVD. For example, the silicon oxide layer is a PTEOS layer. Other types of dielectric layers or deposition techniques may also be useful. A planarizing process, such as CMP, may be performed to provide a planar top surface. The thickness of the second top dielectric layer may be about 4 µm. For example, the planarized second top dielectric layer may be about 4 µm thick. Other thicknesses may also be useful. Top via opening 372 are formed in the second top dielectric layer to expose the via contacts. The top via openings may be formed by mask and etch techniques.

A top device seal or bond ring 334 is formed on the surface of the top device dielectric layer. The bond ring surrounds the device region. In one embodiment, the bond ring is disposed within the isolation region. Other configurations of the bond ring may also be useful. The bond ring facilitates eutectic bonding with another bond ring. The bond ring, for example, may be a metal bond ring, such as Al. Other types of metal bond rings may also be useful. For example, gold (Au), tin (Sn), germanium (Ge), silicon (Si), indium (In), copper (Cu), nickel (Ni), platinum (Pt), titanium (Ti), tantalum (Ta), titanium nitride (TiN) and chromium (Cr).

The bond ring may include a single metal layer. In other embodiments, the bond ring may be a composite bond ring with multiple layers to form a bond ring stack. The multiple layers of the stack may include metal layers, semiconductor layers or a combination thereof. The top layer or exposed layer of the stack includes a layer for facilitating eutectic bonding with another bond ring or bond ring stack.

The bond ring layer or layers may be formed by various techniques. For example, the layer or layers may be formed by physical vapor deposition (PVD), E-beam evaporation, electroplating or a combination thereof. The bond ring layer is patterned to form the bond ring. Pattering the bond ring layer may be achieved using mask and etch techniques. For example, a photoresist layer may be exposed with a reticle containing the desired pattern. After development, the desired pattern on the reticle is transfer to the photoresist layer. The patterned photoresist layer serves as an etch mask for an anisotropic etch, such as a reactive ion etch (RIE). The RIE removes the bond layer exposed by the etch mask, forming the bond ring. Other techniques, such as liftoff may also be employed to form the bond ring.

Referring to FIG. 3h, the top dielectric layer or layers are patterned to expose the surface substrate in the component region. Thereafter, the exposed portion of the surface substrate is patterned to form a portion of a MEMS component on the surface wafer. In one embodiment, the surface wafer is patterned to form a portion of an actuator. For example, a plurality of actuator fins 366 are formed on the surface wafer. Forming other types of MEMS components may also be useful. The portion of the actuator is formed using mask and etch techniques. As shown, the dielectric layer 353 is not patterned. For example, the etch, such as a RIE, that forms the actuator fins stop on the dielectric layer.

In FIG. 3i, a top cap wafer $110_1$ is bonded to the top surface of the device wafer. For example, the top cap bond ring 132 of the top cap wafer is bonded to the top device bond ring 334 on the surface wafer of the device wafer. The top cap wafer forms an upper cavity 327 over the MEMS component. In one embodiment, the top cap wafer is bonded to the device wafer by eutectic bonding to form a top eutectic bond 330. The eutectic bond, for example, may be an Al—Ge eutectic bond. Other types of eutectic bonds, depending on bond rings, may also be useful. The eutectic bond may be formed using a low pressure and a low temperature eutectic bonding process. The bonding temperature, for example, may be about 300-450° C. The bonding temperature and pressure may depend on the bond rings. For example, the bonding temperature and pressure may depend on the type of bond rings and area of the bond. The bonding chamber pressure and piston force may be tuned to produce a thermal compression bond that satisfies device vacuum requirements and pressure based on the bond area.

After bonding the top cap wafer, it may be grinded to reduce its thickness. For example, the thickness of the top cap wafer may be reduced to about 400 µm. Providing a top cap wafer having other thicknesses may also be useful. After grinding, a polishing process, such as CMP, may be performed, producing a smooth planar outer surface for the top cap wafer. Alignment marks 391 and 393 are formed on the outer surface of the top cap wafer. The alignment marks may be formed similar to those formed on the bottom surface of the proof mass wafer. For example, the alignment marks on the proof mass wafer are transferred to the top cap wafer.

After transferring the alignment marks to the top cap wafer, the bottom surface of the proof mass wafer may be grinded to further reduce its thickness. The thickness of the proof mass wafer, for example, is reduced to about 285 µm. Reducing the proof mass wafer to other thicknesses may also be useful.

Figure 3J:
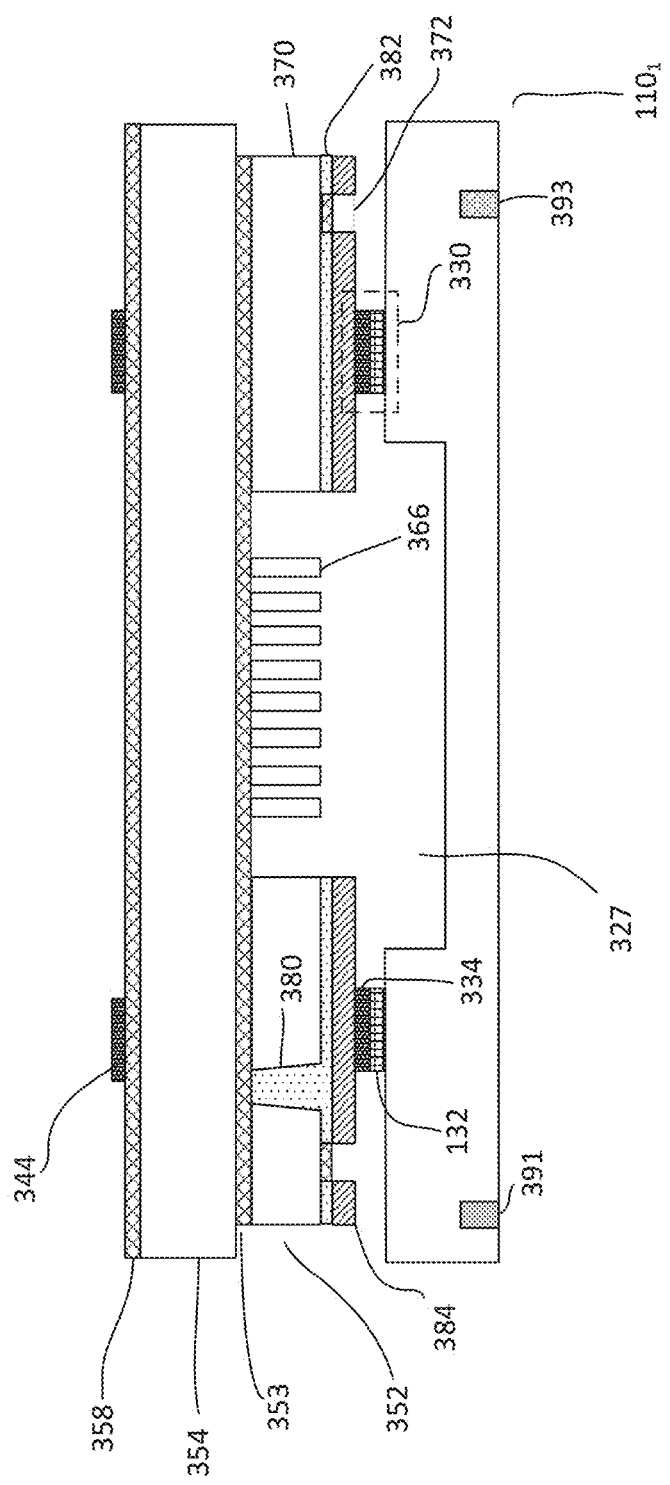

Referring to FIG. 3j, a bottom dielectric layer 358 is formed on the bottom surface of the proof mass wafer. The bottom dielectric layer may be a silicon oxide layer. In one embodiment, the bottom dielectric layer is a silicon oxide layer formed by PECVD. For example, the silicon oxide layer is a PTEOS layer. Other types of dielectric layers or deposition techniques may also be useful.

A bottom device bond ring 344 is formed on the bottom surface of the proof mass wafer. For example, the bottom device bond ring is formed on the bottom dielectric layer. Similar to the top device bond ring, it surrounds the device region. In one embodiment, the bond ring is disposed within the isolation region. Other configurations of the bond ring may also be useful. The bond ring facilitates eutectic bonding with another bond ring. The bond ring, for example, may be a metal bond ring, such as Al. Other types of metal bond rings may also be useful. For example, gold (Au), tin (Sn), germanium (Ge), silicon (Si), indium (In), copper (Cu), nickel (Ni), platinum (Pt), titanium (Ti), tantalum (Ta), titanium nitride (TiN) and chromium (Cr).

The bond ring may include a single metal layer. In other embodiments, the bond ring may be a composite bond ring with multiple layers to form a bond ring stack. The multiple layers of the stack may include metal layers, semiconductor layers or a combination thereof. The top layer or exposed layer of the stack includes a layer for facilitating eutectic bonding with another bond ring or bond ring stack.

The bond ring layer or layers may be formed by various techniques. For example, the layer or layers may be formed by physical vapor deposition (PVD), E-beam evaporation, electroplating or a combination thereof. The bond ring layer is patterned to form the bond ring. Pattering the bond ring layer may be achieved using mask and etch techniques. For example, a photoresist layer may be exposed with a reticle containing the desired pattern. After development, the desired pattern on the reticle is transferred to the photoresist layer. The patterned photoresist layer serves as an etch mask for an anisotropic etch, such as a reactive ion etch (RIE). The RIE removes the bond layer exposed by the etch mask, forming the bond ring. Other techniques, such as liftoff may also be employed to form the bond ring.

Figure 3K:
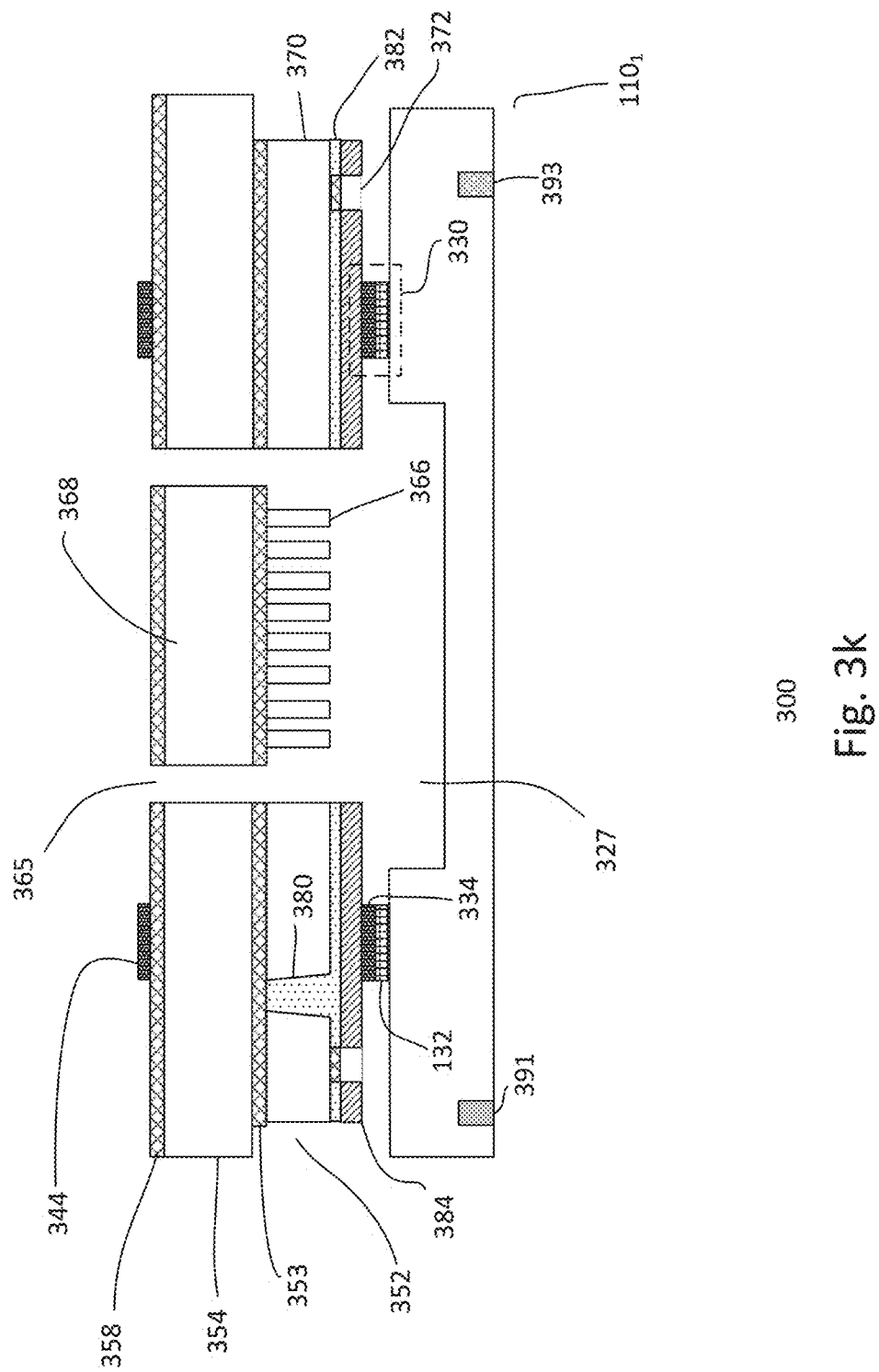

Referring to FIG. 3k, the bottom dielectric layer is patterned to expose the proof mass wafer in the component region. Thereafter, the exposed portion of the proof mass wafer is patterned to form a portion of the MEMS component on the proof mass wafer. In one embodiment, the proof mass wafer is patterned to form a portion of the actuator. For example, a proof mass base 368 and a release channel 365 of the actuator are formed. Forming other types of MEMS components may also be useful. The portion of the actuator is formed using mask and etch techniques.

Figure 3L:
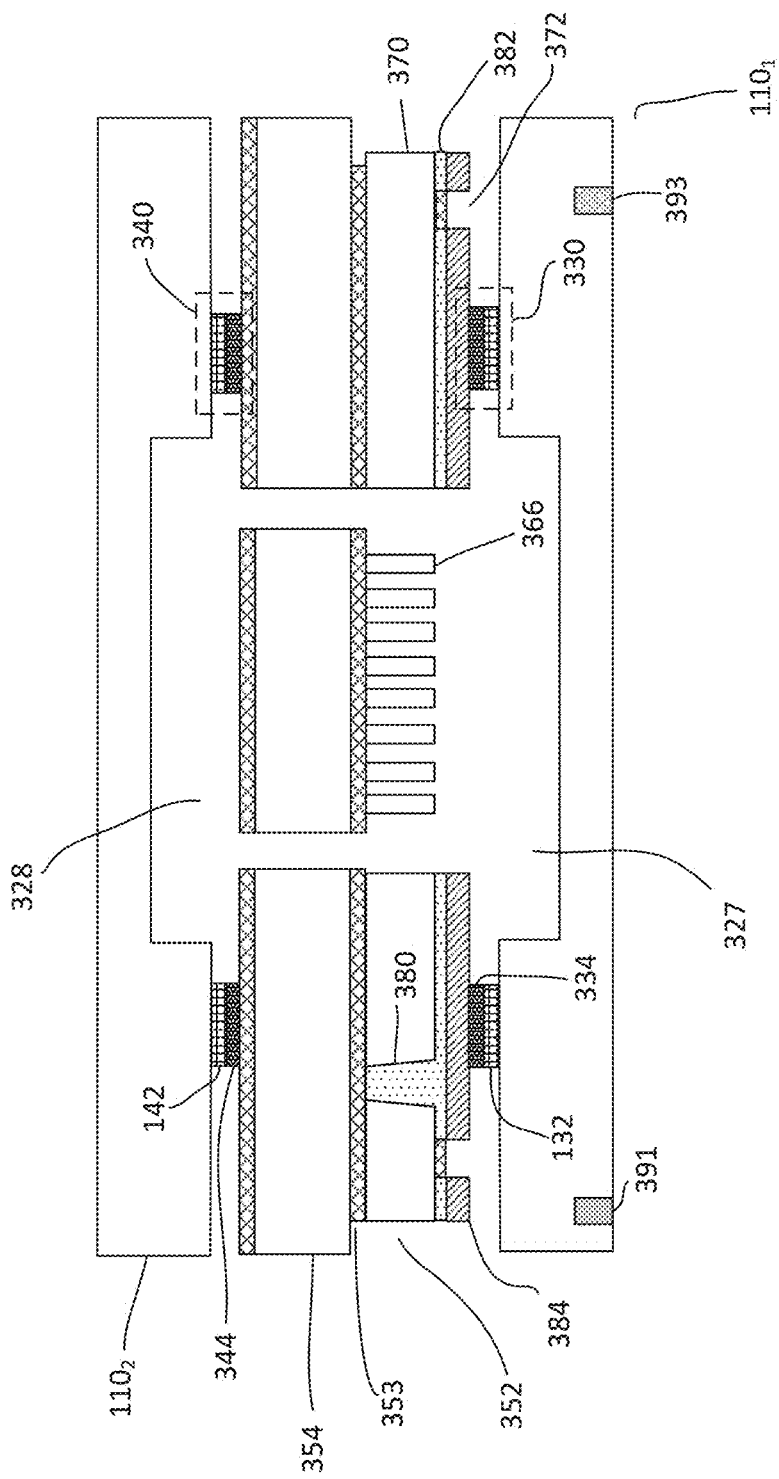

As shown in FIG. 3l, a bottom cap wafer 110₂ is bonded to the top surface of the device wafer. For example, the bottom cap bond ring 142 of the bottom cap wafer is bonded to the top device bond ring 344 on the proof mass wafer of the device wafer. The bottom cap wafer forms a lower cavity 328 below the MEMS component. In one embodiment, the bottom cap wafer is bonded to the device wafer by eutectic bonding to form a bottom eutectic bond 340. The eutectic bond, for example, may be an Al—Ge eutectic bond. Other types of eutectic bonds, depending on bond rings, may also be useful. The eutectic bond may be formed using a low pressure and a low temperature eutectic bonding process. The bonding temperature, for example, may be about 300-450° C. The bonding temperature may depend on the bond rings. The bonding chamber pressure and piston force are tuned to make a thermal compression bond meeting device vacuum requirements and pressure based on bond area respectively. In one embodiment, the bottom eutectic bond is formed using a bonding temperature which is lower than the bonding temperature of the previous or top eutectic bond.

After bonding the bottom cap wafer, it may be grinded to reduce its thickness. For example, the thickness of the top cap wafer may be reduced to about 400 μm. Providing a bottom cap wafer having other thicknesses may also be useful. After grinding, a polishing process, such as CMP, may be performed, producing a smooth planar outer surface for the top cap wafer.

As discussed, the wafer stack of the various bonded wafers includes a plurality of MEMS devices which are formed in parallel. After processing of the wafer stack has been completed, the wafer stack is diced, separating the MEMS devices into individual devices.

Furthermore, as described, top and bottom eutectic bonds for encapsulating the present MEMS devices enables the use of lower temperatures at low pressure than conventional MEMS devices. The low temperature and low pressure bonding reduce stiction of the device membrane to the cap wafers. In addition, eutectic bonding does not require a smooth and flat bonding surface like conventional MEMS devices. Also, the second or bottom eutectic bond may be formed at a lower temperature than the first or top eutectic bond, hence reduces temperature cycling of encapsulating the MEMS devices. This advantageously reduces mechanical stress in the wafer stack.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A microelectromechanical system (MEMS) device comprising:
 a device substrate, the device substrate includes a device region with a MEMS component, the device substrate comprises a top device surface and a bottom device surface, wherein
  the top device surface includes a top device bond ring surrounding the device region, and
  the bottom device surface includes a bottom device bond ring surrounding the device region,
  the device substrate comprises a surface substrate, a proof mass substrate, and a dielectric layer disposed between the surface substrate and proof mass substrate, wherein the surface substrate includes an isolation region extending to the dielectric layer and isolating the device region on the surface substrate;
 a top cap with an outer top cap surface and an inner top cap surface, wherein the inner top cap surface comprises a top cap bond ring surrounding the device region, wherein the top cap bond ring is bonded to the top device bond ring to form a top eutectic bond; and
 a bottom cap with an outer bottom cap surface and an inner bottom cap surface, wherein the inner bottom cap surface comprises a bottom cap bond ring surrounding the device region, wherein the bottom cap bond ring is bonded to the bottom device bond ring to form a bottom eutectic bond.

2. The device of claim 1 wherein:
 one of the top device bond ring and the top cap bond ring comprises aluminum (Al);
 other of the top device bond ring and the top cap bond ring comprises germanium (Ge), the top eutectic bond comprises a top Al—Ge eutectic bond;
 one of the bottom device bond ring and the bottom cap bond ring comprises aluminum (Al); and
 other of the bottom device bond ring and the bottom cap bond ring comprises germanium (Ge), the bottom eutectic bond comprises a bottom Al—Ge eutectic bond.

3. The device of claim 2 wherein:
 the top device bond ring comprises Al;
 the top cap bond ring comprises Ge;
 the bottom device bond ring comprises Al; and
 the bottom cap bond ring comprises Ge.

4. The device of claim 1 wherein the top device bond ring, the top cap bond ring, the bottom device bond ring and bottom cap bond ring comprise Al, Ge, gold (Au), tin (Sn), silicon (Si), indium (In), copper (Cu), nickel (Ni), platinum (Pt), titanium (Ti), tantalum (Ta), titanium nitride (TiN) and chromium (Cr) or a combination thereof.

5. The device of claim 1 wherein the top device bond ring, the top cap bond ring, the bottom device bond ring and bottom cap bond ring comprise:
a single eutectic bondable layer; or
multiple layers including one or more eutectic bondable layer.

6. The device of claim 5 wherein a eutectic bondable layer comprises Al, Ge, gold (Au), tin (Sn), silicon (Si), indium (In), copper (Cu), nickel (Ni), platinum (Pt), titanium (Ti), tantalum (Ta), titanium nitride (TiN) and chromium (Cr) or a combination thereof.

7. A method for forming a MEMS device comprising:
providing a device wafer having a top device surface and a bottom device surface, wherein the device wafer is processed with a MEMS component in a device region of the device wafer, wherein
the top device surface includes a top device bond ring surrounding the device region, and
the bottom device surface includes a bottom device bond ring surrounding the device region,
the device wafer comprises a surface substrate, a proof mass substrate, and a dielectric layer disposed between the surface substrate and proof mass substrate, wherein the surface substrate includes an isolation region extending to the dielectric layer and isolating the device region on the surface substrate;
providing a top cap wafer with an outer top cap surface and an inner top cap surface, wherein the inner top cap surface comprises a top cap bond ring surrounding the device region;
providing a bottom cap wafer with an outer bottom cap surface and an inner bottom cap surface, wherein the inner bottom cap surface comprises a bottom cap bond ring surrounding the device region;
performing a top eutectic bonding process, the top eutectic bonding process forms a top eutectic bond between the top cap bond ring and the top device bond ring; and
performing a bottom eutectic bonding process, the bottom eutectic bonding process forms a bottom eutectic bond between the bottom cap bond ring and the bottom device bond ring.

8. The method of claim 7 wherein:
one of the top device bond ring and the top cap bond ring comprises aluminum (Al);
other of the top device bond ring and the top cap bond ring comprises germanium (Ge), the top eutectic bond comprises a top Al—Ge eutectic bond;
one of the bottom device bond ring and the bottom cap bond ring comprises aluminum (Al); and
other of the bottom device bond ring and the bottom cap bond ring comprises germanium (Ge), the bottom eutectic bond comprises a bottom Al—Ge eutectic bond.

9. The method of claim 8 wherein:
the top device bond ring comprises Al;
the top cap bond ring comprises Ge;
the bottom device bond ring comprises Al; and
the bottom cap bond ring comprises Ge.

10. The method of claim 7 wherein the top device bond ring, the top cap bond ring, the bottom device bond ring and bottom cap bond ring comprise Al, Ge, gold (Au), tin (Sn), silicon (Si), indium (In), copper (Cu), nickel (Ni), platinum (Pt), titanium (Ti), tantalum (Ta), titanium nitride (TiN) and chromium (Cr) or a combination thereof.

11. The method of claim 7 wherein the device wafer comprises:
a surface silicon wafer having a surface wafer top surface and a surface wafer bonding surface;
a proof mass wafer having a proof mass wafer bottom surface and a proof mass wafer bonding surface, wherein at least the proof mass wafer bonding surface includes a bonding dielectric layer; and
performing fusion bonding to bond the surface wafer bonding surface to the bonding dielectric layer on the proof mass wafer bonding surface to form a bonded device wafer, wherein the surface wafer top surface serves as the top surface of the device wafer and the proof mass wafer bottom surface serves as the bottom surface of the device wafer.

12. The method of claim 11 wherein:
the device wafer comprises a plurality of MEMS devices, each MEMS device comprising a MEMS component in the device region and surrounded by a top device bond ring on a top device surface and surrounded by a bottom device bond ring on a bottom device surface;
the top cap wafer with an outer top cap surface and an inner top cap surface, wherein the top cap wafer comprises a plurality of top caps, each top cap comprising a top cap bond ring surrounding the device region;
providing a bottom cap wafer with an outer bottom cap surface and an inner bottom cap surface, wherein the bottom cap wafer comprises a plurality of bottom caps, each bottom cap comprising a bottom cap bond ring surrounding the device region;
performing a top eutectic bonding process, the top eutectic bonding process forms a top eutectic bond between the top cap bond rings and the top device bond rings of the plurality of MEMS devices and top caps; and
performing a bottom eutectic bonding process, the bottom eutectic bonding process forms a bottom eutectic bond between the bottom cap bond rings and the bottom device bond rings of the plurality of MEMS devices and bottom caps; and
dicing the wafer stack comprising the top cap wafer, device wafer and bottom cap wafer to singulate the MEMS devices.

13. The method of claim 7 wherein:
providing the device wafer comprises providing a surface wafer, a proof mass wafer and a bonding dielectric layer between the surface and proof mass wafers, the device wafer is partially processed to form an upper part of the MEMS component in the device region of the surface wafer;
performing the top eutectic bonding process to bond the top cap wafer to the device wafer;
processing the proof mass wafer to form the remaining portion of the MEMS component; and
performing the bottom eutectic bonding process to bond the bottom cap wafer to the device wafer.

14. The method of claim 7 wherein the top eutectic bonding process and the bottom eutectic bonding process are performed with low bonding pressure at a bonding temperature of about 300-450° C.

15. The method of claim 14 wherein:
the top eutectic bonding process is performed prior to the bottom eutectic bonding process; and the bottom eutectic bonding process is performed at a lower bonding temperature than the top eutectic bonding process.

16. A method for forming a MEMS device comprising:
providing a device wafer having a top device surface and a bottom device surface, wherein the device wafer is processed to form a plurality of MEMS devices, wherein
  a MEMS device includes
    a MEMS component in a device region of the device wafer,
    a top device bond ring on the top device surface surrounding the device region, and
    a bottom device bond ring on the bottom device surface surrounding the device region,
  the device wafer comprises a surface substrate, a proof mass substrate, and a dielectric layer disposed between the surface substrate and proof mass substrate, wherein the surface substrate includes an isolation region extending to the dielectric layer and isolating the device region on the surface substrate;
providing a top cap wafer with an outer top cap surface and an inner top cap surface, the top cap wafer comprises a plurality of top caps, wherein a top cap includes a top cap bond ring on the inner top cap surface surrounding the device region;
providing a bottom cap wafer with an outer bottom cap surface and an inner bottom cap surface, the bottom cap wafer comprises a plurality of bottom caps, wherein a bottom cap includes a bottom cap bond ring on the inner bottom cap surface surrounding the device region;
performing a top eutectic bonding process, the top eutectic bonding process forms a top eutectic bond between the top cap bond rings of the top cap wafer and the top device bond rings of the device wafer; and
performing a bottom eutectic bonding process, the bottom eutectic bonding process forms a bottom eutectic bond between the bottom cap bond rings of the bottom cap wafer and the bottom device bond rings of the device wafer.

17. The method of claim 16 wherein the top device bond rings, the top cap bond rings, the bottom device bond rings and bottom cap bond rings comprise Al, Ge, gold (Au), tin (Sn), silicon (Si), indium (In), copper (Cu), nickel (Ni), platinum (Pt), titanium (Ti), tantalum (Ta), titanium nitride (TiN) and chromium (Cr) or a combination thereof.

18. The method of claim 16 wherein the top eutectic bonding process and the bottom eutectic bonding process are performed with low bonding pressure at a bonding temperature of about 300-450° C.

19. The method of claim 16 wherein:
the top device surface comprises a top device dielectric, the top device bond ring is disposed on the top device dielectric; and
the bottom device surface comprises a bottom device dielectric, the bottom device bond ring is disposed on the bottom device surface.

* * * * *